United States Patent [19]
Laue

[11] Patent Number: 5,509,599
[45] Date of Patent: Apr. 23, 1996

[54] METHOD FOR SECURING A HYBRID CIRCUIT ON A PRINTED CIRCUIT BOARD

[75] Inventor: Hans-Bodo Laue, Altenbeken, Germany

[73] Assignee: Siemens Aktiengesellschaft, Munich, Germany

[21] Appl. No.: 194,018

[22] Filed: Feb. 9, 1994

[30] Foreign Application Priority Data

Feb. 26, 1993 [DE] Germany ............... 43 06 021.8
Jun. 16, 1993 [DE] Germany ............... 43 19 876.7

[51] Int. Cl.⁶ .................................................. B23K 31/02
[52] U.S. Cl. ................... 228/180.21; 228/190; 228/254
[58] Field of Search ................. 228/180.21, 190, 228/254

[56] References Cited

U.S. PATENT DOCUMENTS

| | | | |
|---|---|---|---|
| 3,318,993 | 5/1967 | Beelitz | 228/190 |
| 3,926,360 | 12/1975 | Moister, Jr. | 228/180.21 |
| 4,373,259 | 2/1983 | Motsch | 228/180.21 |
| 4,830,264 | 5/1989 | Bitaillou et al. | 228/180.21 |
| 5,048,747 | 9/1991 | Clark et al. | 228/254 |
| 5,383,093 | 1/1995 | Nagasaka | 228/180.22 |

FOREIGN PATENT DOCUMENTS 3316017 11/1984 Germany.

OTHER PUBLICATIONS

Japanese Abstract, S. Naoharu, "Hybrid Integrated Circuit Device", vol. 14, No. 190 (E–0918), JP2037761, Jul. 2, 1990.

Japanese Abstract, T. Eiichi, "Hybrid Circuit Board", vol. 13, No. 568 (E–861), JP1236686, Sep. 21, 1989.

*Primary Examiner*—Samuel M. Heinrich
*Assistant Examiner*—Jeffrey T. Knapp
*Attorney, Agent, or Firm*—Hill, Steadman & Simpson

[57] ABSTRACT

Hybrid circuits are usually secured with contact pins (combs) on printed circuit boards by undergoing a flow solder bath. Further, surface-mountable components are soldered on the printed circuit board in a furnace. Two soldering processes are necessary for this purpose. The method of the invention avoids one of the soldering processes by applying through-contacted bores on the carrier substrate of the hybrid circuit. These through-contacted bores are put in place onto solder surfaces of the printed circuit board having a paste solder and the overall arrangement is soldered in a furnace.

8 Claims, 3 Drawing Sheets

METHOD FOR SECURING A HYBRID CIRCUIT ON A PRINTED CIRCUIT BOARD

BACKGROUND OF THE INVENTION

1. Field of the Invention

The invention is directed generally to a method for securing a hybrid circuit on a printed circuit board in a simplified manner.

2. Description of Prior Art

A current technological trend is to integrate more components in a single electrical component. For example, integrated circuits are among these components, but hybrid circuits are also included. In general, a hybrid circuit is composed of a carrier substrate on whose surface a number of components such as, for example, resistors, capacitors and integrated circuits are attached. For electrical contact, the carrier substrate of the hybrid circuit is secured, for example, to a printed circuit board. To that end, solder surfaces are provided on the carrier substrate. The solder surfaces are in electrical contact with the terminals of the electrical components of the hybrid circuit. Further, contact pins (combs) are soldered to the solder surfaces of the carrier substrate and are subsequently joined to the printed circuit board in a flow solder bath. Additional surface-mountable components are arranged on the printed circuit board and are soldered in by placing the overall arrangement in a furnace. The problem with such a procedure, however, is that a total of two soldering processes must be implemented—the soldering process in the furnace and the flow solder bath—for fastening the hybrid circuit and the additional surface-mountable components on the printed circuit board.

SUMMARY OF THE INVENTION

It is an object of the present invention to provide a method of cost-effectively securing a hybrid circuit as well as surface-mountable components on a printed circuit board in only one soldering process. Moreover, it is an object to provide lower cost manufacture of hybrid circuits.

The objects are inventively achieved in a method for fastening a hybrid circuit on a printed circuit board, where the hybrid circuit has a carrier substrate with surface-mounted electrical components. The method has the steps of locating through-contacted bores at slight spaces from one another on the carrier substrate, providing solder surfaces on the printed circuit board for electrically contacting the hybrid circuit, applying a paste solder onto the solder surfaces of the printed circuit board, and placing the printed circuit board, the hybrid circuit, and the carrier substrate in a furnace for soldering with the paste solder.

An advantage of the invention is the application of bores on the carrier substrate of the hybrid circuit. The bores are thereby through-contacted, (i.e., metallically lined). Further, solder surfaces are applied on the printed circuit board and use a paste solder. The carrier substrate with the through-contacted bores is subsequently located onto the solder surfaces of the printed circuit board. During the soldering process in a furnace, the paste solder becomes liquid and rises into the through-contacted bores. Consequently, the through-contacted bores are optimally applied at a slight spacing from one another. As a result of the slight spacing of the bores from one another, the potential shearing forces are advantageously reduced to have only a comparatively slight effect.

The application of bores on the carrier substrate in the invention is more advantageous and cost-beneficial than the application of contact pins (combs).

An embodiment of the invention has the through-contacted bores attached to the end of the terminals of an integrated circuit. Direct electrical contact at the integrated circuit and a short electrical connection are thus advantageously provided.

In further embodiments of the present invention, at least one discrete component is a printed resistor network or a capacitor network. The resistor embodiment provides the advantage of attaching the printed resistor network under the integrated circuit for space consideration reasons.

In another embodiment of the present invention, the capacitor network has at least one capacitor attached on the printed circuit board. Mechanical relief of the carrier substrate of the hybrid circuit is thereby advantageously provided.

In an embodiment of the invention, the bores are applied in the region of the lateral edges of the carrier substrate as semicircular bores. Advantages of this embodiment include providing that the paste solder can easily rise into the half-open, through-contacted bores during the soldering process in the furnace and the dimensions of the hybrid circuit can be kept slight.

Another embodiment of the invention has the through-contacted bores arranged on the carrier substrate in a circular geometry relative to one another. Extremely slight spacings of the bores from one another can be advantageously selected, and as a result, the influences of shearing forces that occur can be kept slight.

Yet another embodiment of the present invention has the through-contacted bores arranged on the carrier substrate in a rectangular geometry relative to one another. Thus, the through-contacted bores can be applied with extremely slight spacing from one another, and as an advantageous result, the influences of shearing forces that occur can be kept slight.

BRIEF DESCRIPTION OF THE DRAWINGS

The invention shall be set forth in greater detail below with reference to the figures and exemplary embodiments of the invention.

DESCRIPTION OF THE PREFERRED EMBODIMENT

Figure 1:
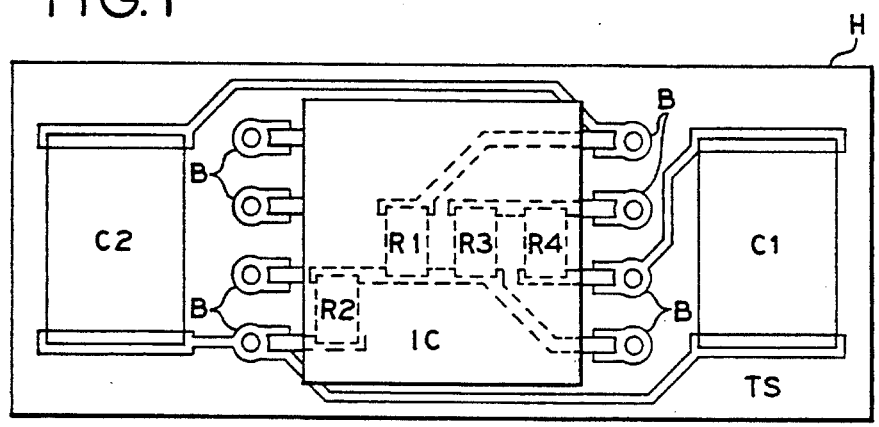
FIG. 1 is a plan view of the apparatus of the invention.
Figure 4:
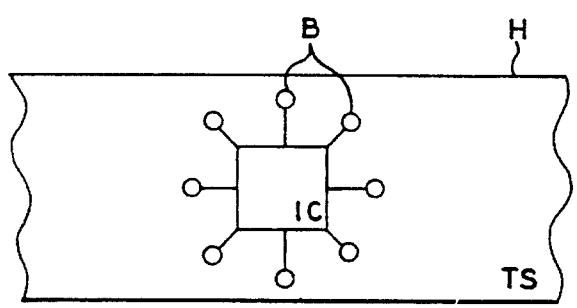
FIG. 4 is a plan view of an embodiment of the apparatus of the present invention.
Figure 5:
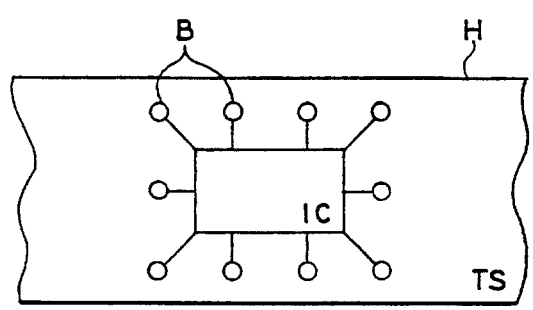
FIG. 5 is a plan view of another embodiment of the apparatus of the present invention.
Figure 6:
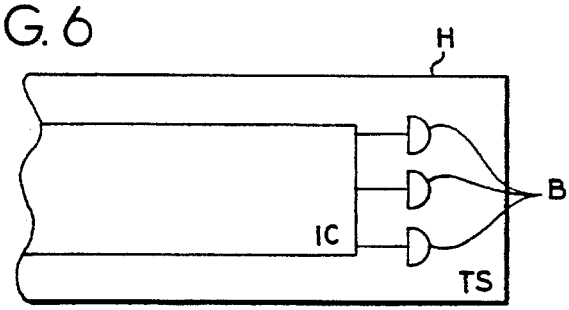
FIG. 6 is a further embodiment of the apparatus of the present invention.
Figure 3:
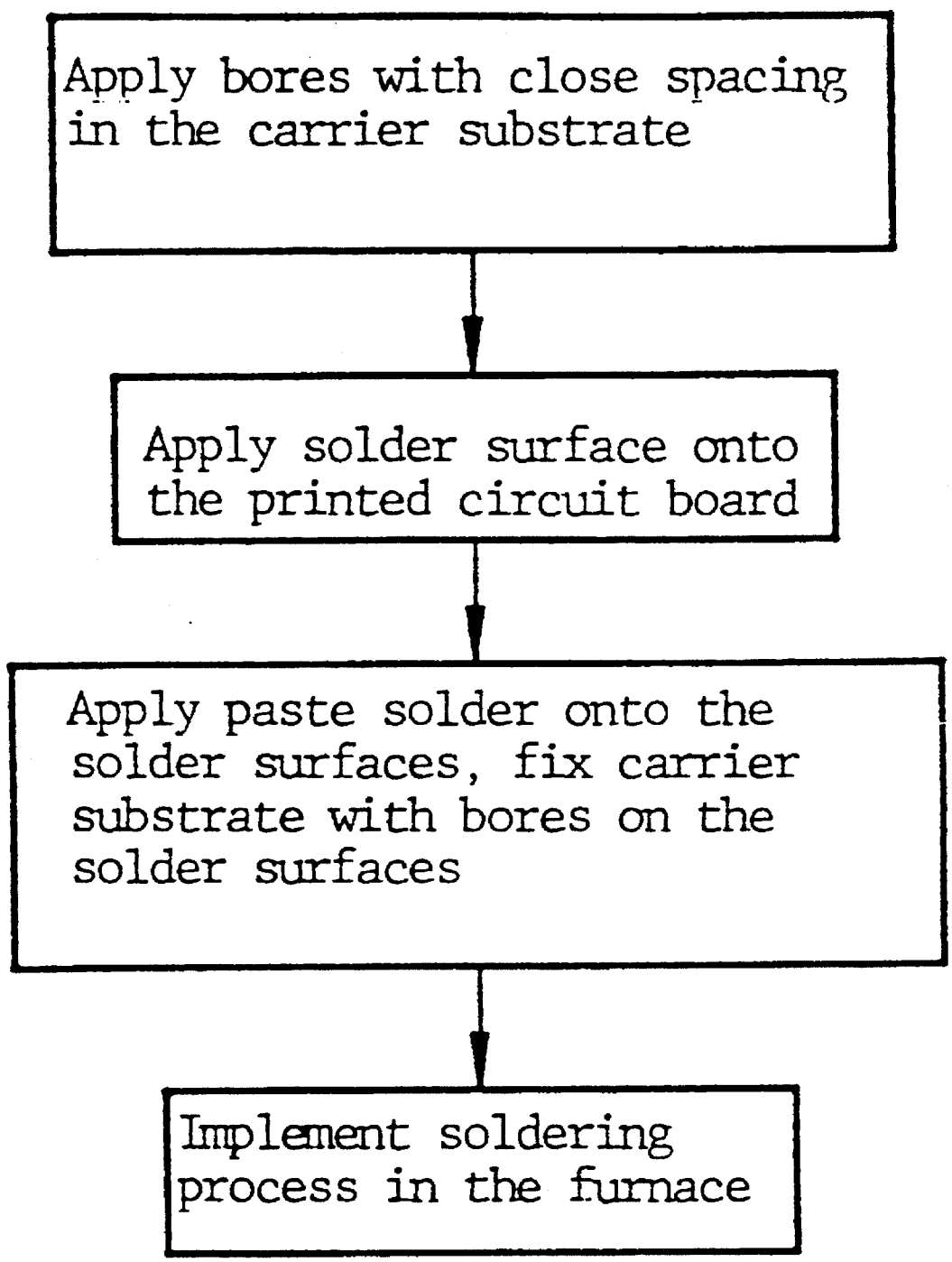
FIG. 3 is a flowchart depicting the method of the invention.

FIG. 1 shows a plan view of a hybrid circuit H. The circuit has a plurality of electrical components arranged on a carrier substrate TS. In an exemplary embodiment, for example, these components are an integrated circuit IC, two capacitors C1, C2 as well as a resistor network having resistors R1 through R4. The resistor network is a printed circuit and is arranged under the integrated circuit IC. In the present invention, through-contacted bores B are also applied in the carrier substrate TS at the terminals of the integrated circuit IC. In general, care must be exercised to see that the through-contacted bores B are optimally applied with the slightest geometrical spacing from one another. The effects of the shearing forces that arise in the cooling process can thereby be minimized. In an exemplary embodiment, this condition is established by the application of the contacted bores B at the end of the terminals of the integrated circuit IC. In general, other geometrical arrangements are likewise conceivable, such as, for example, applying the through-contacted bores B under the integrated circuit IC in a circular or rectangular geometry. Such a circular geometry for the through-contacted bores B is illustrated in FIG. 3. Similarly, the rectangular geometry orientation of the through-contacted bores B is illustrated in FIG. 4. Another possible embodiment uses semicircular bores, (i.e. half-open bores) or recesses. Such an embodiment using semicircular bores is illustrated in FIG. 5.

Figure 2:
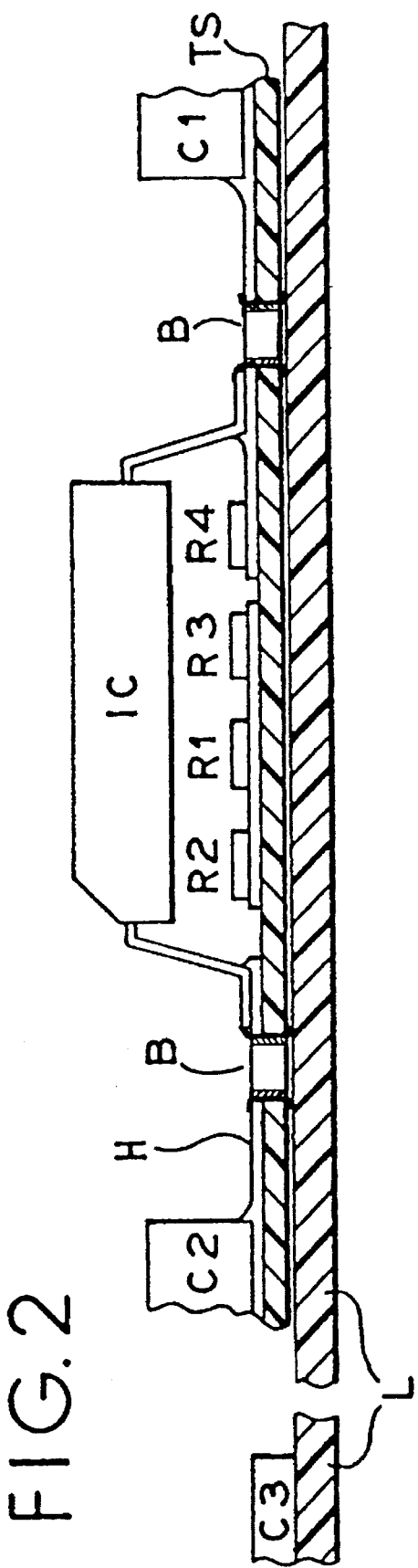
FIG. 2 is a side view of the apparatus of the invention.

FIG. 2 shows a side view of the hybrid circuit 1H together with the printed circuit board L. The hybrid circuit with its carrier substrate TS is thereby fixed on the printed circuit board L by a paste solder. During the soldering process, the paste solder in its liquid condition rises at the through-contacted bores B and, in the cooled condition, provides a reliable connection between the electrical terminals of the hybrid circuit H and the printed circuit board L. Also illustrated on the PCB L is a capacitor C3.

The method of the invention is disclosed in a simplified flowchart in FIG. 3. In a first step, the through-contacted bores B are applied in the carrier substrate TS. In an exemplary embodiment, the through-contacted bores B are arranged at the end of the terminals of the integrated circuit IC. Such a procedure assures that the through-contacted bores B are arranged at a slight spacing from one another in every case. This is a critical feature of the invention, since the mechanical stresses that occur when cooling the carrier substrate TS and the printed circuit board L are intercepted by the solidified paste solder. In further embodiments of the invention, other geometrical arrangements of the bores B are also possible. Thus, for example, the bores B can be applied in a circular or a rectangular shape under the integrated circuit IC. Also, solder surfaces for subsequent contacting of the carrier substrate TS are applied on the printed circuit board L. A paste solder is spread onto the solder surfaces. The geometrical arrangement of the solder surfaces is selected such that the carrier substrate TS with the through-contacted bores B can be placed onto the solder surfaces of the printed circuit board L. The overall arrangement—(i.e., the printed circuit board L with the solder surfaces as well as the carrier substrate TS with the through-contacted bores B that are now fixed on the solder surfaces of the printed circuit board L)—is placed in a furnace. During the soldering process, the paste solder becomes liquid and rises into the through-contacted bores B. A reliable electrical connection between the printed circuit board L and the hybrid circuit H is thus provided.

Only one carrier substrate was addressed in the above embodiment. However, a multitude of materials such as hard paper, fiberglass weave, plastic, ceramic, etc., can be used as a carrier substrate.

Although other modifications and changes may be suggested by those skilled in the art, it is the intention of the inventor to embody within the patent warranted hereon all changes and modifications as reasonably and properly come within the scope of his contribution to the art.

I claim:

1. A method for fastening a hybrid circuit having a carrier substrate onto a printed circuit board, said carrier substrate having a surface with electrical components disposed thereon, comprising the steps of:

locating through-contacted bores at slight spaces from one another on said carrier substrate;

providing solder surfaces on said printed circuit board for electrically contacting said hybrid circuit;

applying a paste solder onto said solder surfaces of said printed circuit board;

placing said carrier substrate of said hybrid circuit having said through-contacted bores onto said solder surfaces of said printed circuit board; and placing said printed circuit board and said hybrid circuit in a furnace for soldering with said paste solder.

2. Method according to claim 1, wherein said hybrid circuit further comprises an integrated circuit, and said method further comprising the additional step of attaching said through-contacted bores to terminal ends of said integrated circuit.

3. Method according to claim 1, wherein said method is further defined by providing a printed resistor network on said carrier substrate.

4. Method according to claim 1, wherein said locating step is further defined by locating said bores as semicircular bores in a region of the lateral edges of said carrier substrate.

5. Method according to claim 1, wherein said locating step is further defined by locating said bores on said carrier substrate in a circular geometry relative to one another.

6. Method according to claim 1, wherein said locating step is further defined by locating said bores on said carrier substrate in a rectangular geometry relative to one another.

7. Method according to claim 1, wherein said method is further defined by providing a capacitor network on said carrier substrate.

8. Method according to claim 7, wherein the step of providing a capacitor network is further defined by providing a capacitor network having at least one capacitor electrically connected to said printed circuit board.

* * * * *